(12) United States Patent
Hoshi

(10) Patent No.: US 12,477,787 B2
(45) Date of Patent: Nov. 18, 2025

(54) SILICON CARBIDE SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 431 days.

(21) Appl. No.: 18/193,888

(22) Filed: Mar. 31, 2023

(65) Prior Publication Data

US 2023/0387193 A1   Nov. 30, 2023

(30) Foreign Application Priority Data

May 26, 2022 (JP) ................................. 2022-085668

(51) Int. Cl.
  *H10D 62/10* (2025.01)
  *H10D 30/66* (2025.01)
  *H10D 62/832* (2025.01)

(52) U.S. Cl.
  CPC ......... *H10D 62/105* (2025.01); *H10D 30/665* (2025.01); *H10D 62/8325* (2025.01)

(58) Field of Classification Search
  CPC ............... H10D 62/105; H10D 30/665; H10D 62/8325; H10D 30/668; H10D 12/031; H10D 62/157; H10D 62/106; H10D 62/107; H10D 62/112
  See application file for complete search history.

(56) References Cited

U.S. PATENT DOCUMENTS

| | | | |
|---|---|---|---|
| 9,966,460 B2 * | 5/2018 | Soeno | H01L 23/5283 |
| 2018/0040688 A1 * | 2/2018 | Kobayashi | H10D 62/105 |
| 2018/0166530 A1 | 6/2018 | Lichtenwalner et al. | |
| 2018/0366574 A1 * | 12/2018 | Ohse | H10D 12/031 |
| 2019/0140095 A1 | 5/2019 | Okumura | |
| 2022/0102485 A1 * | 3/2022 | Takaya | H10D 64/513 |

FOREIGN PATENT DOCUMENTS

| | | |
|---|---|---|
| JP | 2019087646 A | 6/2019 |
| JP | 2020202404 A | 12/2020 |
| JP | 2021048423 A | 3/2021 |

* cited by examiner

*Primary Examiner* — Syed I Gheyas
(74) *Attorney, Agent, or Firm* — Rabin & Berdo, P.C.

(57) ABSTRACT

An active region has, in a periphery thereof, a p-type outer peripheral region that has sequentially from a front surface of a semiconductor substrate, a $p^{++}$-type contact extension portion, a p-type base extension portion, and an upper portion and a lower portion of a $p^+$-type extension portion, so as to form, at an outer end portion thereof, steps that are recessed stepwise toward a center of the active region and that in a depth direction, are arranged in ascending order of proximity thereof to the center. An innermost JTE region configuring a voltage withstanding structure contacts an outer end portion of the contact extension portion. Beneath the JTE region, a $p^+$-type embedded region is provided at a same depth as the lower portion of the extension portion so as to be apart from the JTE region and the outer peripheral region and surround the periphery of the active region.

13 Claims, 7 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2022-085668, filed on May 26, 2022, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, a voltage withstanding structure of a power semiconductor device is disposed in an edge termination region, which is between an active region and an end of a semiconductor substrate (semiconductor chip); in the edge termination region, the voltage withstanding structure is configured by multiple p-type regions selectively provided in a surface region of an n$^-$-type drift region that is exposed at a front surface of the semiconductor substrate. In an instance in which silicon carbide (SiC) is a semiconductor material of a power semiconductor device, disposal of a junction termination extension (JTE) structure as a voltage withstanding structure is commonly known.

A JTE structure is a structure in which multiple p-type regions (hereinafter, JTE regions) are disposed adjacently to one another in concentric shapes surrounding a periphery of the active region; the JTE regions are disposed in descending order of impurity concentration thereof, in a direction from an inner side (center portion (chip center) side of the semiconductor substrate) to an outer side (end (chip end) side of the semiconductor substrate). Electric field strength tends to decrease in a direction from the active region to the chip end. According to this trend of the electric field strength distribution, in a direction from the active region to the chip end, the JTE regions are disposed in descending order of impurity concentration thereof, whereby a predetermined breakdown voltage of the edge termination region is stably maintained.

FIG. 7 is a cross-sectional view depicting a structure of a conventional silicon carbide semiconductor device. A conventional silicon carbide semiconductor device 110 depicted in FIG. 7 has a voltage withstanding structure 130 in an edge termination region 102 of a semiconductor substrate (semiconductor chip) 140 that contains silicon carbide; the conventional silicon carbide semiconductor device 110 is vertical metal oxide semiconductor electric field effect transistor (MOSFET) having a trench gate structure with insulated gates (MOS gates) having a three-layered structure including a metal, an oxide film, and a semiconductor.

The semiconductor substrate 140 is formed by epitaxially growing an n$^-$-type silicon carbide layer 142 that constitutes an n$^-$-type drift region 112, on a front surface of an n$^+$-type starting substrate 141 that contains silicon carbide. The semiconductor substrate 140 has, as a front surface, a main surface that has the n$^-$-type silicon carbide layer 142 and, as a back surface, a main surface that has the n$^+$-type starting substrate 141. An entire area of the front surface of the semiconductor substrate 140 is flat, that is, between an active region 101 and the edge termination region 102 is free of a step. At the front surface of the semiconductor substrate 140, an entire area of the edge termination region 102 is covered by an insulating film 119.

An entire area of the back surface of the semiconductor substrate 140 (back surface of the n$^+$-type starting substrate 141) is covered by a drain electrode 145. The n$^+$-type starting substrate 141 constitutes an n$^+$-type drain region 111. The active region 101 is disposed in a center (chip center) of the semiconductor substrate 140. Between the active region 101 and the end (the chip end) of the semiconductor substrate 140 is the edge termination region 102. In a center portion (not depicted) of the active region 101, multiple unit cells of the MOSFET, each having the same structure (trench gate structure), are provided adjacently to one another.

In an outer peripheral portion 101b of the active region 101, in an entire region between the front surface of the semiconductor substrate 140 and the n$^-$-type drift region 112, adjacently in a depth direction sequentially from the front surface of the semiconductor substrate 140, a p$^{++}$-type contact extension portion 115a, a p-type base extension portion 113a, and the p$^+$-type extension portion 122a are provided. These regions configure a single p-type outer peripheral region 125 in an entire area between the front surface of the semiconductor substrate 140 and the n$^-$-type drift region 112, in the outer peripheral portion 101b of the active region 101.

The p$^{++}$-type contact extension portion 115a, the p-type base extension portion 113a, and the p$^+$-type extension portion 122a are regions, respectively, formed concurrently with p-type regions of the same impurity concentration and at the same depth in the active region 101 and surround a periphery of the center portion of the active region 101. Outer ends of the p$^{++}$-type contact extension portion 115a, the p-type base extension portion 113a, and the p$^+$-type extension portion 122a terminate at different positions, respectively, thereby forming, at the outer end of the p-type outer peripheral region 125, multiple steps that are recessed stepwise toward the chip center and thereby, in the depth direction from the front surface of the semiconductor substrate 140, are arranged in ascending order of proximity thereof to the chip center.

The edge termination region 102 surrounds a periphery of the active region 101. In the edge termination region 102, the voltage withstanding structure 130 is provided. The voltage withstanding structure 130 is, for example, a spatial modulation JTE structure that is an improved JTE structure, configured by multiple p-type regions 131 and multiple the p$^-$-type regions 132 selectively provided between the front surface of the semiconductor substrate 140 and the n$^-$-type drift region 112. All the p-type regions 131 and the p$^-$-type regions 132 are exposed at the front surface of the semiconductor substrate 140 and are in contact with the insulating film 119 on the front surface of the semiconductor substrate 140.

The p-type regions 131 are disposed apart from one another in concentric shapes surrounding the periphery of the active region 101. An innermost one of the p-type regions 131 is disposed in contact with the p$^{++}$-type contact extension portion 115a and is closer to the chip end than is the p$^{++}$-type contact extension portion 115a. The p$^-$-type regions 132 are disposed apart from one another in concentric shapes surrounding the periphery of the active region 101. An innermost one of the p$^-$-type regions 132 is provided so that portions thereof are between all the p-type regions 131 that are adjacent to one another, whereby the portions are adjacent to the p-type regions 131 on both sides thereof in a radial direction from the chip center to the chip end, in a plane of the front surface of the semiconductor substrate 140.

The innermost one of the p⁻-type regions 132 extends closer to the chip center than is an outermost one of the p-type regions 131. All the p-type regions 131 and the innermost one of the p⁻-type regions 132 are fixed to a potential of a source electrode (not depicted) via the p⁺⁺-type contact extension portion 115a. Excluding the innermost one of the p⁻-type regions 132, the p⁻-type regions 132 are disposed closer to the chip end than are the p-type regions 131. The n⁻-type drift region 112 is provided so that portions thereof are between all the p⁻-type regions 132 that are adjacent to one another, the portions being exposed at the front surface of the semiconductor substrate 140 between the p⁻-type regions 132 that are adjacent to one another.

As for a conventional silicon carbide semiconductor device, a device has been proposed in which a p-type region configuring a voltage withstanding structure is disposed so that a bottom (end facing toward the back surface of the semiconductor substrate) thereof is positioned at a same depth from the front surface of the semiconductor substrate as is a bottom of a p-type region that forms an outermost peripheral end (hereinafter, main junction end) of a main junction (pn junction) of the active region (for example, refer to Japanese Laid-Open Patent Publication No. 2020-202404 and Japanese Laid-Open Patent Publication No. 2021-048423). In Japanese Laid-Open Patent Publication No. 2020-202404, electric field concentration at the main junction end of the active region is suppressed by the p-type region of the JTE structure, the p-type region of the JTE structure being disposed adjacent to an outer side of the p-type region forming the main junction end of the active region, the bottom of the p-type region of the JTE structure being positioned at the same depth as that of the p-type region forming the main junction end.

Further, in Japanese Laid-Open Patent Publication No. 2020-202404, the structure is flat, spanning an entire area of the front surface of the semiconductor substrate, with no step being formed between the active region and the edge termination region, and a p-type region of the active region and a p-type region configuring the JTE structure are formed at positions that are a same depth from the front surface of the semiconductor substrate, whereby positioning accuracy by photolithography is enhanced. In Japanese Laid-Open Patent Publication No. 2021-048423, a p-type region configuring a voltage withstanding structure and a p-type region of the active region are formed concurrently at the same depth, whereby the number of processes is reduced.

Further, as for another conventional silicon carbide semiconductor device, a device has been proposed in which an edge termination region with a spatial modulation structure is configured by an outer end portion (portion facing the chip end) of a p⁺-type electric field mitigating region that extends to the edge termination region from the active region and an outer end portion of a p-type region configuring a JTE structure in the edge termination region (for example, refer to Japanese Laid-Open Patent Publication No. 2019-087646). In Japanese Laid-Open Patent Publication No. 2019-087646, the spatial modulation structure is configured by the outer end portion of the p⁺-type electric field mitigating region and the outer end portion of the p-type region configuring the JTE structure and the depth decreases in a direction from the chip center to the chip end, whereby electric field concentration is mitigated in the depth direction as well.

SUMMARY OF THE INVENTION

According to an embodiment of the present invention, a silicon carbide semiconductor device includes: a semiconductor substrate containing silicon carbide and having a first main surface and a second main surface that are opposite to each other, an entire area of the first main surface being flat, the semiconductor substrate having an active region in a center of the semiconductor substrate and a termination region that surrounds a periphery of the active region; a first semiconductor region of a first conductivity type, provided in the semiconductor substrate, spanning the active region and the termination region; a second semiconductor region of a second conductivity type, provided between the first main surface and the first semiconductor region, in the active region; a device structure having a pn junction between the first semiconductor region and the second semiconductor region, a current that passes through the pn junction flowing through the device structure; a second-conductivity-type outer peripheral region surrounding the periphery of the active region, the second-conductivity-type outer peripheral region being provided between the first main surface and the first semiconductor region, between the device structure and the termination region; a voltage withstanding structure configured by a plurality of second-conductivity-type voltage withstanding regions, provided between the first main surface and the first semiconductor region, in the termination region, the plurality of second-conductivity-type voltage withstanding regions being provided apart from one another in a direction parallel to the first main surface in concentric shapes surrounding the periphery of the active region; a first electrode electrically connected to the second semiconductor region and the second-conductivity-type outer peripheral region, the first electrode being provided at the first main surface; and a second electrode electrically connected to the first semiconductor region, the second electrode being provided on the second main surface of the semiconductor substrate. The second-conductivity-type outer peripheral region has, at an outer end portion thereof, a plurality of extension portions each extending outward in a radial direction toward an end of the semiconductor substrate and terminating so that in the depth direction from the first main surface, the plurality of extension portions are arranged in descending order of proximity thereof to the end of the semiconductor substrate, thereby forming a plurality of steps that are recessed stepwise from an outer end of the outer end portion toward the center of the semiconductor substrate and in a depth direction from the first main surface, are arranged in ascending order of proximity thereof to the center. The voltage withstanding structure is in contact with an outer end of a first extension portion that is an uppermost one among the plurality of extension portions, the uppermost one being closest to the first main surface among the plurality of extension portions. The silicon carbide semiconductor device further comprises in the termination region, a second-conductivity-type embedded region surrounding the periphery of the active region, the second-conductivity-type embedded region being provided apart from the voltage withstanding structure and the second-conductivity-type outer peripheral region, at a same depth as a depth of a second extension portion that is a lowermost one among the plurality of extension portions, the lowermost one being closest to the second main surface among the plurality of extension portions.

Objects, features, and advantages of the present invention are specifically set forth in or will become apparent from the following detailed description of the invention when read in conjunction with the accompanying drawings.

DETAILED DESCRIPTION OF THE INVENTION

Figure 7:
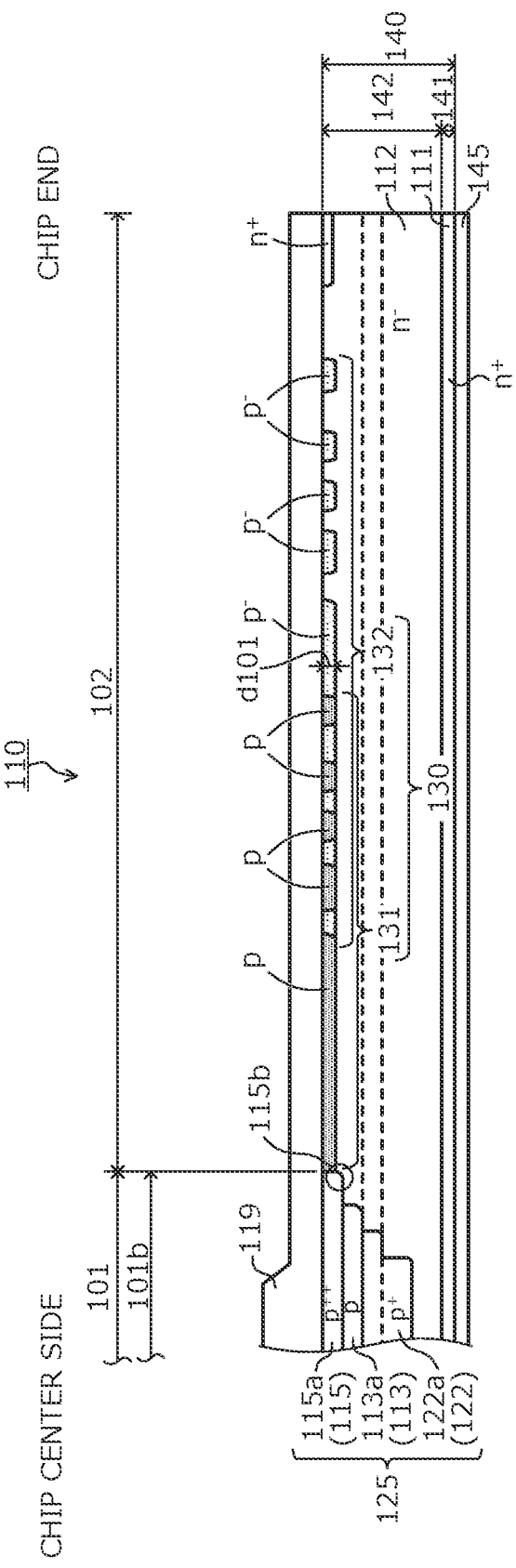
FIG. 7 is a cross-sectional view depicting a structure of a conventional silicon carbide semiconductor device.

First, problems associated with the conventional techniques are discussed. With the conventional silicon carbide semiconductor device 110 (Refer to FIG. 7), in general, to simplify the processes, the voltage withstanding structure 130 (in FIG. 7, the p-type regions 131 and the p$^-$-type regions 132) is formed at a shallow depth d101 of about 0.5 μm from the front surface of the semiconductor substrate 140. Therefore, when a device structure, such as the trench gate structure, that reaches a relatively deeper position from the front surface of the semiconductor substrate 140 in the active region 101 is formed, the depth of the bottom of the voltage withstanding structure 130 is shallow from the front surface of the semiconductor substrate 140 as compared to the depth of the bottom (end facing the back surface of the semiconductor substrate 140) of the p-type outer peripheral region 125 forming the main junction end of the active region 101.

The positions of bottoms of the p-type regions (the p-type regions 131 and the p$^-$-type regions 132) configuring the voltage withstanding structure 130 are shallow, whereby of the p-type outer peripheral region 125 forming the main junction end of the active region 101, the p$^{++}$-type contact extension portion 115a that extends closest to the chip end has, at the bottom thereof, an outer corner portion 115b that is structured to be surrounded by the n$^-$-type drift region 112. Therefore, electric field concentrates at the outer corner portion 115b, whereby avalanche breakdown easily occurs at the outer corner portion 115b and the breakdown voltage of the edge termination region 102 becomes lower than the breakdown voltage of the active region 101. The breakdown voltage of the silicon carbide semiconductor device 110 overall is determined by the edge termination region 102 and thus, reliability decreases.

For a typical voltage withstanding structure, to reduce the number of processes, the p-type regions configuring the voltage withstanding structure are formed concurrently with p-type regions having the same impurity concentration and the same depth in the active region. Nonetheless, similarly to Japanese Laid-Open Patent Publication No. 2020-202404, in an instance in which the impurity concentration of the p-type regions of the active region and the impurity concentration of the p-type regions configuring the voltage withstanding structure differ from each other, the p-type regions of the active region and the p-type regions configuring the voltage withstanding structure are each formed by ion implantation under respectively different conditions (number of stages and dose amounts) to adjust the difference in the impurity concentrations. Thus, positioning the bottom of the p-type region that is outermost in the active region and the bottoms of the p-type regions configuring the voltage withstanding structure at the same depth is difficult.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 1:
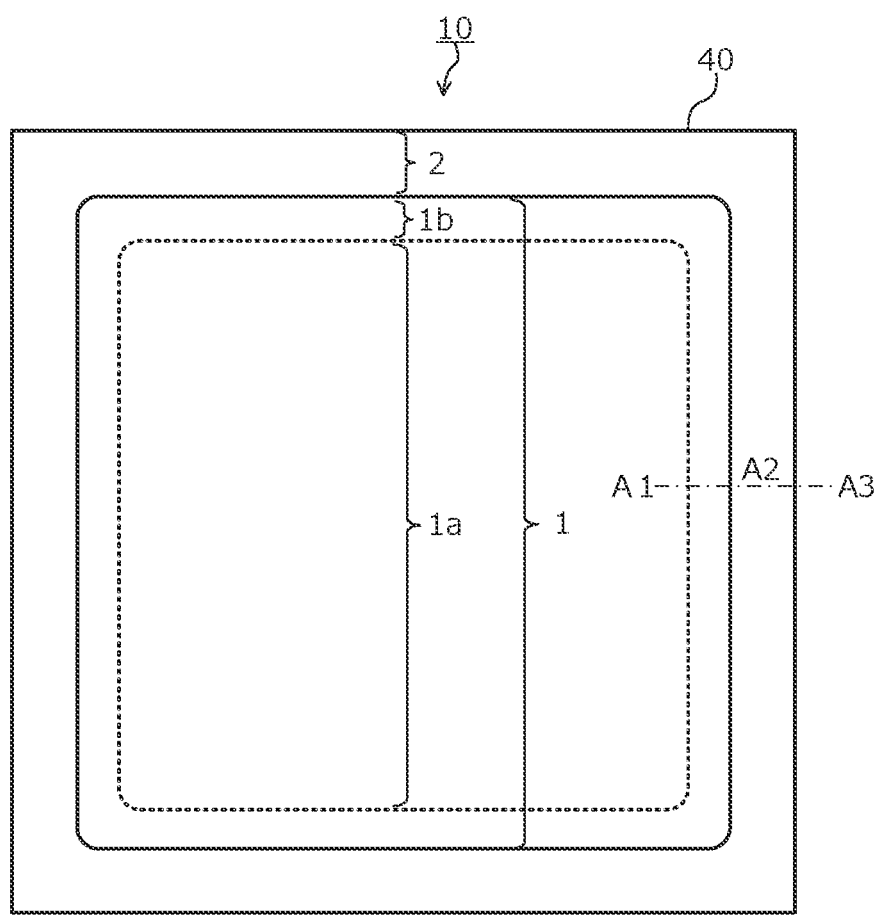
FIG. 1 is a plan view depicting a layout when a silicon carbide semiconductor device according to a first embodiment is viewed from a front side of a semiconductor substrate thereof.
Figure 2:
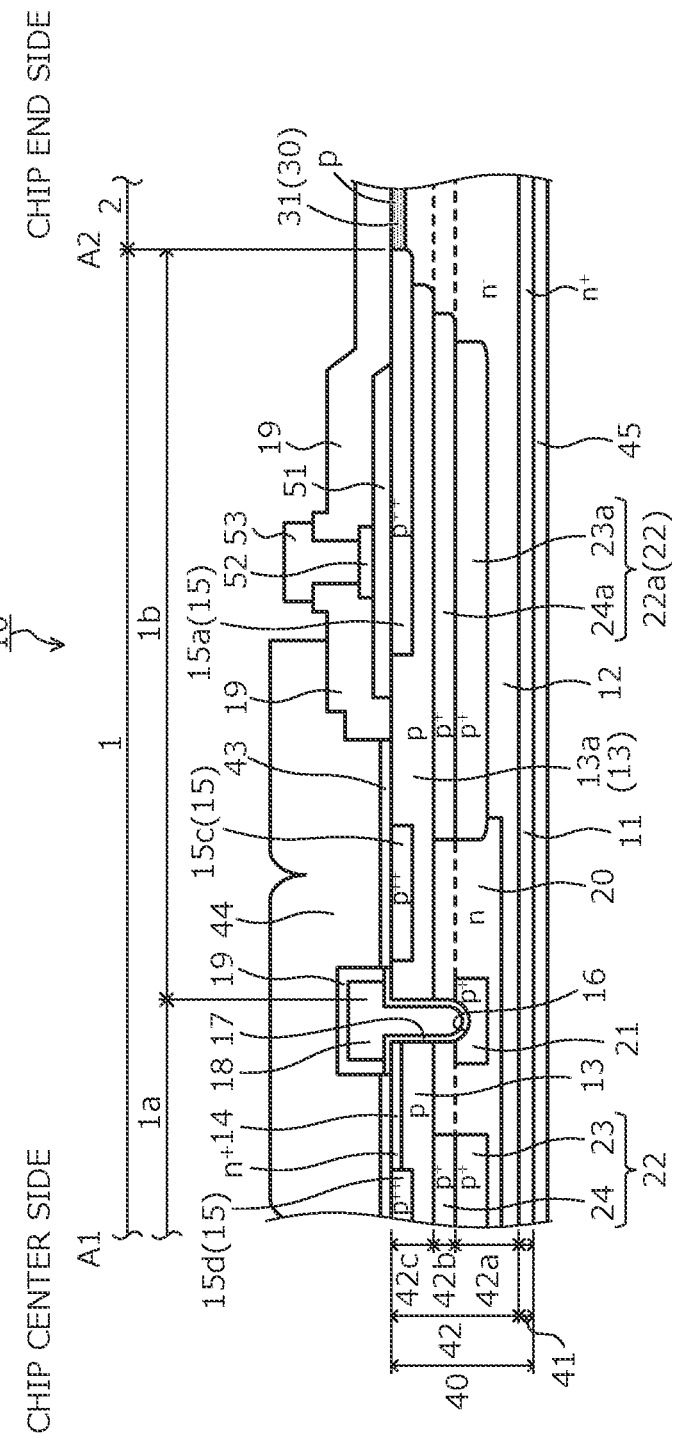
FIG. 2 is a cross-sectional view depicting a structure along cutting line A1-A2 in FIG. 1.
Figure 3:
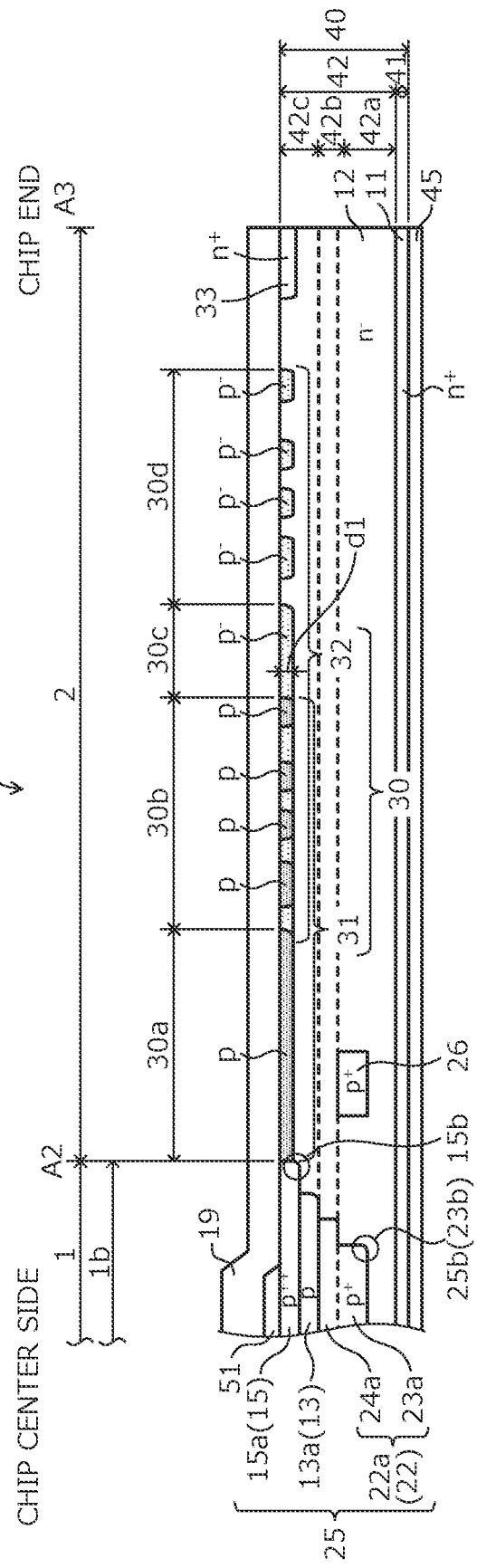
FIG. 3 is a cross-sectional view depicting the structure along cutting line A2-A3 in FIG. 1.

A structure of a silicon carbide semiconductor device according to a first embodiment is described. FIG. 1 is a plan view depicting a layout when the silicon carbide semiconductor device according to the first embodiment is viewed from a front side of a semiconductor substrate thereof. FIGS. 2 and 3 are cross-sectional views depicting the structure along cutting line A1-A2 and cutting line A2-A3 in FIG. 1, respectively. A silicon carbide semiconductor device 10 according to the first embodiment depicted in FIGS. 1 to 3 is a vertical MOSFET with a trench gate structure that has a voltage withstanding structure 30 in an edge termination region 2 of a semiconductor substrate (semiconductor chip) 40 thereof that contains silicon carbide (SiC).

In the semiconductor substrate 40, multiple unit cells (functional units of the device) of the MOSFET, each having the same structure (device structure), are disposed adjacently to one another in a center portion 1a of an active region 1. The active region 1 is a region through which a main current (drift current) flows when the MOSFET is on. The active region 1 has a substantially rectangular shape in a plan view thereof and is disposed in substantially a center (chip center) of the semiconductor substrate 40. The active region 1 is a portion inward (direction to the chip center, from the end of (the chip end) of the semiconductor substrate 40) from an outer end of a later-described p$^{++}$-type contact extension portion 15a.

The edge termination region 2 is a region between the active region 1 and the chip end and has a substantially rectangular shape surrounding the periphery of the active region 1 in a plan view. The voltage withstanding structure 30 is provided in the edge termination region 2. The voltage withstanding structure 30 has a function of mitigating electric field near a border between the active region 1 and the edge termination region 2 and a function of sustaining a breakdown voltage. A configuration of the voltage withstanding structure 30 is described hereinafter. The breakdown voltage is a voltage limit at which, even when current between a drain and source increases due to avalanche breakdown occurring at pn junctions, voltage between the drain and source does not further increase.

The semiconductor substrate 40 is formed by epitaxially growing, on a front surface of an n$^+$-type starting substrate 41 containing silicon carbide, a silicon carbide layer 42 of an n-type and constituting an n$^-$-type drift region (first semiconductor region) 12. The semiconductor substrate 40 has, as a front surface (first main surface), a main surface having the silicon carbide layer 42 and, as a back surface (second main surface), a main surface having the n+-type starting substrate 41. An entire area of the front surface of the semiconductor substrate 40 is substantially flat and no step occurs between the active region 1 and the edge termination region 2. Substantially flat means a horizontal surface within a range that includes an allowable error due to process variation.

The n+-type starting substrate 41 constitutes an n+-type drain region 11. The silicon carbide layer 42 (42a, 42b, 42c) of an n−-type and constituting the n−-type drift region 12 is formed in stages sequentially by epitaxial growth when regions of the active region 1 are formed. The n−-type drift region 12 is a portion of the n−-type silicon carbide layer 42, free of diffused regions formed by ion implantation and having an impurity concentration left unchanged after the epitaxial growth of the n−-type silicon carbide layer 42. The n−-type drift region 12 is in contact with the n+-type starting substrate 41 and provided spanning the active region 1 to the chip end.

The trench gate structure is configured by a p-type base region (second semiconductor region) 13, n+-type source regions (third semiconductor regions) 14, p++-type contact regions 15, trenches 16, gate insulating films 17, and gate electrodes 18. The p-type base region 13, the n+-type source regions 14, and the p++-type contact regions 15 are diffused regions formed in the silicon carbide layer 42c of an n−-type by ion implantation. The p-type base region 13 is provided in the center portion 1a of the active region 1, in an entire area between the front surface of the semiconductor substrate 40 and the n−-type drift region 12, the p-type base region 13 extends outwardly toward the chip end and terminates in an outer peripheral portion 1b of the active region 1.

The n+-type source regions 14 and the p++-type contact regions 15 are each selectively provided between the front surface of the semiconductor substrate 40 and the p-type base region 13, and bottoms (lower surfaces: ends facing the back surface of the semiconductor substrate 40) thereof are in contact with the p-type base region 13. The n+-type source regions 14 are provided in contact with p++-type contact regions 15d (15) of the center portion 1a of the active region 1, only in the center portion 1a of the active region 1. The n+-type source regions 14 and the p++-type contact regions 15d, at upper surfaces (ends facing toward the front surface of the semiconductor substrate 40) thereof, are in ohmic contact with ohmic electrodes 43.

P++-type contact regions 15c (15), 15a (15) of the outer peripheral portion 1b of the active region 1 surround a periphery of the center portion 1a of the active region 1 in concentric shapes. In the outer peripheral portion 1b of the active region 1, the p++-type contact region 15c, which is innermost, is in ohmic contact at the upper surface thereof, with one of the ohmic electrodes 43. In the outer peripheral portion 1b of the active region 1, the p++-type contact region 15c faces a later-described n-type current spreading region 20 in the depth direction. In the outer peripheral portion 1b of the active region 1, the p++-type contact region 15c may face inner ends (ends closest to the chip center) of later-described p+-type extension portions 22a.

In the outer peripheral portion 1b of the active region 1, an outermost p++-type contact region (hereinafter, p++-type contact extension portion) 15a is provided apart from the p++-type contact region 15c, which is closer to the chip center, the p++-type contact extension portion 15a extends outwardly toward the chip end and is terminated by the border between the active region 1 and the edge termination region 2. The p++-type contact regions 15c, 15d may be omitted. In this instance, instead of the p++-type contact regions 15c, 15d, the p-type base region 13 reaches the front surface of the semiconductor substrate 40 and is in contact with the ohmic electrodes 43.

Between the n−-type drift region 12 and the p-type base region 13, at positions closer to the n+-type drain region 11 (back surface of the semiconductor substrate 40) than are the bottoms of the trenches 16, the n-type current spreading region 20 and p+-type regions (second-conductivity-type high-concentration regions) 21, 22 are each selectively provided. The n-type current spreading region 20 and the p+-type regions 21, 22 are diffused regions formed in the n−-type silicon carbide layers 42a, 42b by ion implantation. Preferably, the n-type current spreading region 20 may reach a position closer to the n+-type drain region 11 than are the p+-type regions 21, 22.

The n-type current spreading region 20 is a so-called current spreading layer (CSL) that reduces carrier spreading resistance. The n-type current spreading region 20 is between each adjacent two of the p+-type regions 21, 22 and is in contact with these regions; the n-type current spreading region 20 extends to the trenches 16, in a direction parallel to the front surface of the semiconductor substrate 40 and is in contact with the gate insulating films 17. The n-type current spreading region 20, at an upper surface thereof, is in contact with the p-type base region 13 and at a bottom thereof, is in contact with the n−-type drift region 12.

The n-type current spreading region 20 extends outwardly toward the chip end, from the center portion 1a of the active region 1 and terminates in the outer peripheral portion 1b of the active region 1. The n-type current spreading region surrounds the inner ends of the later-described p+-type extension portions 22a. The n-type current spreading region 20 may be omitted. In an instance in which the n-type current spreading region 20 is omitted, instead of the n-type current spreading region 20, the n−-type drift region 12 reaches the p-type base region 13, is in contact with the p-type base region 13 and the p+-type regions 21, 22, and extends in a direction parallel to the front surface of the semiconductor substrate to reach the trenches 16 and be in contact with the gate insulating films 17.

The p+-type regions 21, 22 are fixed to a potential of a later-described source electrode 44 and have a function of depleting (or causing the n-type current spreading region 20 to deplete, or both) when the MOSFET (the silicon carbide semiconductor device 10) is off and, thereby, mitigating electric field applied to the gate insulating films 17. The p+-type regions 21 are provided apart from the p-type base region 13 and face the bottoms of the trenches 16 in the depth direction. The p+-type regions 21 are partially connected to the p+-type regions 22 by a non-depicted portion and are, thereby, electrically connected to the source electrode 44.

The p+-type regions 21 may be in contact with the gate insulating films 17 at the bottoms of the trenches 16 or may be apart from the bottoms of the trenches 16. A width of each of the p+-type regions 21 may be the same as or wider than a width of each of the trenches 16. The width of each of the p+-type regions 21 is set to be wider than the width of the trenches 16, whereby the p+-type regions 21 further face corner portions (borders between the sidewalls and the bottom) of the bottoms of the trenches 16, in the depth direction. As a result, the effect of mitigating electric field near the bottoms of the trenches 16 by the p$^+$-type regions 21 increases.

Each of the p$^+$-type regions 22 is provided between an adjacent two of the trenches 16 so to be apart from the p$^+$-type regions 21 and the trenches 16. Each of the p$^+$-type regions 22, at the upper surface thereof, is in contact with the p-type base region 13 and is electrically connected to the source electrode 44 via the p-type base region 13. Each of the p$^+$-type regions 22 is formed by an upper portion (portion facing the n$^+$-type source regions 14) 24 formed in the n$^-$-type silicon carbide layer 42b and a lower portion (portion facing the n$^+$-type drain region 11) 23 formed in the n$^-$-type silicon carbide layer 42a, the upper portion 24 and the lower portion 23 being adjacent to each other in the depth direction.

Further, one of the p$^+$-type regions 22 is provided in the outer peripheral portion 1b of the active region 1, apart from the trenches 16. The p$^+$-type region 22 (hereinafter, the p$^+$-type extension portion 22a) of the outer peripheral portion 1b of the active region 1 surrounds a periphery of the center portion 1a of the active region 1. All the p$^+$-type regions 21, 22 of the center portion 1a of the active region 1 are connected to the p$^+$-type extension portion 22a. The p$^+$-type extension portion 22a is formed by an upper portion (fourth extension portion) 24a formed in the n$^-$-type silicon carbide layer 42b and a lower portion (second extension portion) 23a formed in the n$^-$-type silicon carbide layer 42a, the lower portion 24a and the upper portion 23a being adjacent to each other in the depth direction. An outer end portion (portion facing the chip end) of the p$^+$-type extension portion 22a terminates closer to the chip center than does the p-type base region 13.

The trenches 16 penetrate through the n$^+$-type source regions 14 and the p-type base region 13 in the depth direction and reach the n-type current spreading region 20 (in an instance in which the n-type current spreading region 20 is omitted, the n$^-$-type drift region 12). The trenches 16 may terminated in the p$^+$-type regions 21. The trenches 16, for example, extend in a striped pattern, in a direction parallel to the front surface of the semiconductor substrate 40, and reach the outer peripheral portion 1b of the active region 1. In the trenches 16, the gate electrodes 18 are provided, via the gate insulating films 17, respectively.

The outer peripheral portion 1b of the active region 1 surrounds the periphery of the center portion 1a of the active region 1 in a substantially rectangular shape in a plan view. In a longitudinal direction of the trenches 16, the outer peripheral portion 1b of the active region 1 is a portion from an outermost end of the n$^+$-type source regions 14, to the border between the active region 1 and the edge termination region 2. In a lateral direction of the trenches 16, the outer peripheral portion 1b of the active region 1 is a portion from an outermost sidewall of an outermost one of the trenches 16, to the border between the active region 1 and the edge termination region 2. The outer peripheral portion 1b of the active region 1 is free of the unit cells of the MOSFET.

In the outer peripheral portion 1b of the active region 1, in an entire region between the front surface of the semiconductor substrate 40 and the n$^-$-type drift region 12, the p$^{++}$-type contact extension portion (first extension portion) 15a, p-type base extension portion (third extension portion) 13a, and the p$^+$-type extension portion (extension portion) 22a are provided adjacent to one another, sequentially in the depth direction, from the front surface of the semiconductor substrate 40. In the outer peripheral portion 1b of the active region 1, these regions (multiple extension portions) configure a single p-type outer peripheral region (second-conductivity-type outer peripheral region) 25, in an entire area between the front surface of the semiconductor substrate 40 and the n$^-$-type drift region 12.

The p-type base extension portion 13a is provided between the front surface of the semiconductor substrate 40 and the n$^-$-type drift region 12 and is in contact with the n$^-$-type drift region 12. The p$^{++}$-type contact extension portion 15a is provided between the front surface of the semiconductor substrate 40 and the p-type base extension portion 13a and is in contact with the p-type base extension portion 13a. The p$^{++}$-type contact extension portion 15a is exposed at the front surface of the semiconductor substrate 40 and is in contact with an insulating film (insulating film in which a field oxide film 51 and an interlayer insulating film 19 are sequentially stacked) on the front surface of the semiconductor substrate 40.

The p$^+$-type extension portion 22a is provided between the p-type base extension portion 13a and the n$^-$-type drift region 12 so as to be in contact with these regions. The p$^{++}$-type contact extension portion 15a, the p-type base extension portion 13a, and the p$^+$-type extension portion 22a are regions that are formed concurrently with the p$^{++}$-type contact regions 15d, the p-type base region 13, and the p$^+$-type regions 22 of the center portion 1a of the active region 1, respectively, and that surround the periphery of the center portion 1a of the active region 1. The p-type outer peripheral region 25 has a function of making electric field at the front surface of the semiconductor substrate 40 in the outer peripheral portion 1b of the active region 1 uniform.

Further, the p-type outer peripheral region 25 is a region for leading holes out to the source electrode 44; the holes are generated by the n$^-$-type drift region 12 in the edge termination region 2 when the MOSFET (the silicon carbide semiconductor device 10) is off, and flow toward the active region 1. The hole current generated by the n$^-$-type drift region 12 in the edge termination region 2 when the MOSFET is off is lead out to the source electrode 44 via the p-type outer peripheral region 25, whereby concentration of the hole current during avalanche breakdown in the edge termination region 2 is suppressed.

Respective outer end portions of the p$^{++}$-type contact extension portion 15a, the p-type base extension portion 13a, the upper portion 24a of the p$^+$-type extension portion 22a, and the lower portion 23a of the p$^+$-type extension portion 22a terminate at different positions from each other. In particular, the outer end portion of the p$^{++}$-type contact extension portion 15a is positioned at the border between the active region 1 and the edge termination region 2. The outer end portion of the p-type base extension portion 13a terminates closer to the chip center than is the outer end portion of the p$^{++}$-type contact extension portion 15a. The outer end portion of the upper portion 24a of the p$^+$-type extension portion 22a terminates closer to the chip center than is the outer end portion of the p-type base extension portion 13a.

The outer end portion of the lower portion 23a of the p$^+$-type extension portion 22a terminates closer to the chip center than is the outer end portion of the upper portion 24a of the p$^+$-type extension portion 22a. As a result, at the outer end portion of the p-type outer peripheral region 25, multiple steps are formed that are recessed stepwise toward the chip center and thereby, in the depth direction from the front surface of the semiconductor substrate 40, are arranged in ascending order of proximity thereof to the chip center. In other words, of the p$^{++}$-type contact extension portion 15a, the p-type base extension portion 13a, and the p$^+$-type extension portion 22a configuring the p-type outer peripheral region 25, the p$^{++}$-type contact extension portion 15a, which is closest to the front surface of the semiconductor substrate 40, extends closest to the chip end.

As a result, when the MOSFET is off, while an outer corner portion 15b of the bottom of the p$^{++}$-type contact extension portion 15a is a location of electric field concentration, electric field concentration at the outer corner portion 15b is mitigated by the voltage withstanding structure 30, which is adjacent to the p$^{++}$-type contact extension portion 15a and closer to the chip end than is the p$^{++}$-type contact extension portion 15a. Further, the p-type base extension portion 13a, the upper portion 24a of the p$^{+}$-type extension portion 22a, and the lower portion 23a of the p$^{+}$-type extension portion 22a each terminates closer to the chip center than is an outer end portion of a p-type region directly thereabove (direction to the front surface of the semiconductor substrate 40) and adjacent thereto and thus, local concentration of electric field at the outer corner portions of the bottoms of these regions is suppressed.

The interlayer insulating film 19 is provided in an entire area of the front surface of the semiconductor substrate 40 and covers the gate electrodes 18 and a gate polysilicon wiring layer 52. In the outer peripheral portion 1b of the active region 1 and the edge termination region 2, the field oxide film 51 is provided between the front surface of the semiconductor substrate 40 and the interlayer insulating film 19. The gate polysilicon wiring layer 52 is disposed between the field oxide film 51 and the interlayer insulating film 19, in the outer peripheral portion 1b of the active region 1. The gate polysilicon wiring layer 52 surrounds the periphery of the center portion 1a of the active region 1.

A gate metal wiring layer 53 is provided on the gate polysilicon wiring layer 52, via a contact hole of the interlayer insulating film 19. The gate polysilicon wiring layer 52 and the gate metal wiring layer 53 configure a gate runner. The gate electrodes 18 are connected to the gate polysilicon wiring layer 52, at the ends of the trenches 16 in the longitudinal direction thereof. All the gate electrodes 18 are electrically connected to a gate pad (electrode pad: not depicted) via the gate polysilicon wiring layer 52 and the gate metal wiring layer 53.

Preferably the structure may be the same directly beneath (direction to the n$^{+}$-type drain region 11) the gate runner; and directly beneath the gate runner, the p-type outer peripheral region 25 alone is provided between the front surface of the semiconductor substrate 40 and the n$^{-}$-type drift region 12. An entire surface of the gate runner faces the p$^{++}$-type contact extension portion 15a, the p-type base extension portion 13a, and the p$^{+}$-type extension portion 22a in the depth direction, with the field oxide film 51 intervening therebetween. The gate runner is disposed closer to the chip center than is the voltage withstanding structure 30 of the edge termination region 2.

Ohmic electrodes (first electrodes) 43 are provided on portions of the front surface of the semiconductor substrate 40, exposed by contact holes of the interlayer insulating film 19. At the front surface of the semiconductor substrate 40, in the contact holes of the interlayer insulating film 19, the ohmic electrodes 43 are in ohmic contact with the n$^{+}$-type source regions 14 and the p$^{++}$-type contact regions 15d, 15c (in an instance in which the p$^{++}$-type contact regions 15d, 15c are omitted, the p-type base region 13). The ohmic electrodes 43, for example, are a nickel silicide (Ni$_x$Si$_y$, where, x and y are arbitrary integers) films.

The source electrode (first electrodes) 44 is provided on the interlayer insulating film 19 so as to be embedded in contact holes of the interlayer insulating film 19. The source electrode 44 is provided in substantially an entire area of the center portion 1a of the active region 1 and extends in the outer peripheral portion 1b of the active region 1 but does not reach the gate metal wiring layer 53. The source electrode 44 is electrically connected to the n$^{+}$-type source regions 14, the p$^{++}$-type contact regions 15d, 15c, the p-type base region 13, the p$^{+}$-type regions 21, 22, the p$^{++}$-type contact extension portion 15a, the p-type base extension portion 13a, and the p$^{+}$-type extension portion 22a, via the ohmic electrodes 43.

The source electrode 44 is in ohmic contact with the p$^{++}$-type contact region 15c via a contact hole in the interlayer insulating film 19, in the outer peripheral portion 1b of the active region 1, and is electrically connected to the p$^{++}$-type contact region 15c, the p$^{++}$-type contact extension portion 15a, the p-type base extension portion 13a, and the p$^{+}$-type extension portion 22a. A drain electrode (second electrode) 45 is provided in an entire area of the back surface (back surface of the n$^{+}$-type starting substrate 41) of the semiconductor substrate 40, is in ohmic contact with the n$^{+}$-type drain region 11 (the n$^{+}$-type starting substrate 41), and is electrically connected to the n$^{+}$-type drain region 11.

The voltage withstanding structure 30 of the edge termination region 2 is a spatial modulation JTE structure having, for example, a JTE structure as a spatial modulation structure, and is configured by multiple p-type regions (second-conductivity-type voltage withstanding regions) 31 and multiple p$^{-}$-type regions (second-conductivity-type voltage withstanding regions) 32 provided between the front surface of the semiconductor substrate 40 and the n$^{-}$-type drift region 12. The p-type regions 31 and the p$^{-}$-type regions 32 are diffused regions formed in the n$^{-}$-type silicon carbide layer 42c, at the surface thereof, by ion implantation, and all of these regions have substantially a same shallow depth d1 of about 0.5 μm from the front surface of the semiconductor substrate 40.

Depths of the bottoms of the p-type regions 31 and the p$^{-}$-type regions 32 are shallower from the front surface of the semiconductor substrate 40 than is a depth of the bottom of the p$^{++}$-type contact extension portion 15a. Thus, the outer corner portions of the bottoms of the p$^{++}$-type contact extension portion 15a, the p-type base extension portion 13a, the upper portion 24a of the p$^{+}$-type extension portion 22a, and the lower portion 23a of the p$^{+}$-type extension portion 22a are surrounded by the n$^{-}$-type drift region 12. The p-type regions 31 and the p$^{-}$-type regions 32 are in contact with the insulating film (the interlayer insulating film 19 and the field oxide film 51) on the front surface of the semiconductor substrate 40.

The p-type regions 31 are disposed apart from one another in concentric shapes surrounding the periphery of the active region 1. The p-type regions 31 are disposed in descending order of width (width in the radial direction, which is a direction from the chip center to the chip end, in a plan view (in a plane of the front surface of the semiconductor substrate 40) and an interval between any one of the p-type regions 31 and an adjacent one of the p-type regions 31 (the adjacent one closer to the chip center) is wide. An innermost one (first second-conductivity-type voltage withstanding region) of the p-type regions 31 is disposed adjacent to the p$^{++}$-type contact extension portion 15a, closer to the chip end than is the p$^{++}$-type contact extension portion 15a. In FIGS. 2 and 3, the p-type regions 31 and the p$^{-}$-type regions 32 are indicated by different hatching.

The p$^{-}$-type regions 32 are disposed apart from one another in concentric shapes surrounding the periphery of the active region 1. The p$^{-}$-type regions 32 are disposed in descending order of width (width in the radial direction) in the radial direction and an interval between any one of the p⁻-type regions 32 and an adjacent one of the p⁻-type regions 32 (the adjacent one of the p⁻-type regions 32 closer to the chip center) is wide. A width of an outermost of the p⁻-type regions 32 may be wider than the width of the adjacent one (closer to the chip center) of the p⁻-type regions 32. An innermost one of the p⁻-type regions 32 is disposed so that portions thereof are between all the p-type regions 31 that are adjacent to one another, whereby the portions are adjacent to the p-type regions 31 on both sides thereof in the radial direction and corner portions of the bottoms of all the p-type regions 31 are surrounded.

An inner end of the innermost one the p⁻-type regions 32 terminates at the same position as the outer end portion of the innermost one of the p-type regions 31 or terminates closer to the chip end than is the outer end portion of the innermost one of the p-type regions 31. A number of the p⁻-type regions 32 are provided closer to the chip center than is the outermost one of the p-type regions 31. The p⁻-type regions 32 excluding the p⁻-type regions 32 relatively close to the chip center are disposed closer to the chip end than are the p-type regions 31. Portions of the n⁻-type drift region 12 extend between the p⁻-type regions 32, which are adjacent to one another, the portions reaching the front surface of the semiconductor substrate 40 and being adjacent to the p⁻-type regions 32 on both sides thereof in the radial direction.

All the p-type regions 31 and a number of the p⁻-type regions 32 relatively closer to the chip center are fixed to the potential of the source electrode 44, via the p⁺⁺-type contact extension portion 15a. The innermost one of the p-type regions 31 (JTE region 30a) and of the p⁻-type regions 32, a portion (JTE region) 30c that is closer to the chip end than is the outermost one of the p-type regions 31 configure a double-zone JTE structure. The p-type regions 31 excluding the JTE region 30a and the number of the p⁻-type regions 32 relatively close to the chip center configure a spatial modulation region 30b between the JTE regions 30a, 30c. The n⁻-type drift region 12 and the p⁻-type regions 32 closer to the chip end than is the JTE region 30c configure a spatial modulation region 30d that is adjacent to the JTE region 30c and closer to the chip end than is the JTE region 30c.

The spatial modulation region 30b is formed by disposing two sub-regions (the p-type regions 31 and the p⁻-type regions 32) adjacent to each other so as to repeatedly alternate with one another in a predetermined pattern, the two sub-regions respectively having the substantially same impurity concentrations as those of the regions (the JTE regions 30a, 30c) respectively adjacent on opposite sides of the spatial modulation region 30b in the radial direction. The spatial modulation region 30d is formed by disposing two sub-regions (the p⁻-type regions 32 and the n⁻-type drift region 12) adjacent to each other so as to repeatedly alternate with one another in a predetermined pattern, the two sub-regions respectively having substantially the same impurity concentrations as those of the regions (the JTE region 30c and the n⁻-type drift region 12) respectively adjacent on opposite sides of the spatial modulation region 30d in the radial direction. Overall spatial impurity concentration distributions of the spatial modulation regions 30b, 30d are determined by the widths and impurity concentration ratios.

As described, the voltage withstanding structure 30 has the JTE regions 30a, 30c and the spatial modulation regions 30b, 30d. In this instance, the voltage withstanding structure 30 is a spatial modulation JTE structure that has the spatial modulation region 30b disposed between the JTE regions 30a, 30c, which are adjacent to each other, the spatial modulation region 30b having an impurity concentration distribution that is spatially equivalent to an intermediate impurity concentration of the impurity concentrations of these two regions (the JTE regions 30a, 30c), the spatial modulation JTE structure further having between the JTE region 30c and a portion of the n⁻-type drift region 12 closer to the chip end than is the JTE region 30c, the spatial modulation region 30d, which has an impurity concentration distribution that is spatially equivalent to an intermediate impurity concentration of the impurity concentrations of these two regions (the JTE region 30c and the portion of the n⁻-type drift region 12), and thus, the voltage withstanding structure 30 overall has a p-type impurity concentration that gradually decreases in a direction from the chip center to the chip end.

The voltage withstanding structure 30 may be a single-zone JTE structure configured by only a single JTE region (not depicted). In this instance, the voltage withstanding structure 30 is a spatial modulation JTE structure that has a spatial modulation region disposed between the one JTE region and the portion of the n⁻-type drift region closer to the chip end than is the one JTE region, the spatial modulation region having an impurity concentration distribution that is spatially equivalent to an intermediate impurity concentration of the impurity concentrations of these two regions (the one JTE region and the portion of the n⁻-type drift region) and thus, the voltage withstanding structure 30 overall has a p-type impurity concentration that gradually decreases in a direction from the chip center to the chip end. The spatial modulation JTE structure may stably ensure a predetermined breakdown voltage of the edge termination region 2 as compared to a general JTE structure without a spatial modulation region.

Directly beneath the innermost one of the p-type regions 31 (the JTE region 30a), a p⁺-type region (hereinafter, p⁺-type embedded region (second-conductivity-type embedded region)) 26 is selectively provided in the n⁻-type drift region 12, apart from the JTE region 30a and the n⁺-type drain region 11 in the depth direction. The p⁺-type embedded region 26 is provided at substantially the same depth as that of the lower portion 23a of the p⁺-type extension portion 22a, apart from the p-type outer peripheral region 25 in the radial direction; and the p⁺-type embedded region 26 surrounds the periphery of the active region 1. The p⁺-type embedded region 26 is a diffused region in the n⁻-type silicon carbide layer 42a formed by ion implantation.

The p⁺-type embedded region 26 may preferably have substantially the same impurity concentration and width as the impurity concentration and width of the lower portion 23a of the p⁺-type extension portion 22a. A reason for this is that the p⁺-type embedded region 26 may be formed concurrently with the lower portion 23a of the p⁺-type extension portion 22a (i.e., the lower portions 23 of the p⁺-type regions 22), whereby the number of processes may be reduced. Substantially the same impurity concentration, substantially the same depth, and substantially the same thickness mean, respectively, the same impurity concentration, the same depth, and the same thickness within ranges that include allowable error due process variation.

The p⁺-type embedded region 26 is provided, whereby electric field concentration at an outer corner portion 25b (outer corner portion 23b of the bottom of the lower portion 23a of the p⁺-type extension portion 22a) of the bottom of the p-type outer peripheral region 25 may be suppressed. The entire p⁺-type embedded region 26 suffices to be positioned directly beneath the JTE region 30a and a width of the $p^+$-type embedded region 26 in the radial direction may be suitably set. An inner end (end facing the chip center) of the $p^+$-type embedded region 26 may be positioned at the border between the active region 1 and the edge termination region 2. The $p^+$-type embedded region 26 may be provided in plural apart from one another, in concentric shapes that surround the periphery of the active region 1 (not depicted).

Further, between the front surface of the semiconductor substrate 40 and the $n^-$-type drift region 12, an $n^+$-type channel stopper region 33 is selectively provided closer to the chip end than is the voltage withstanding structure 30. The $n^+$-type channel stopper region 33 is a diffused region formed by ion implantation in the $n^-$-type silicon carbide layer 42c, at the surface thereof. The $n^+$-type channel stopper region 33 is provided apart from the voltage withstanding structure 30 and closer to the chip end in the radial direction than is the voltage withstanding structure 30; the $n^+$-type channel stopper region 33 surrounds a periphery of the voltage withstanding structure 30. The $n^+$-type channel stopper region 33 is in contact with the insulating film on the front surface of the semiconductor substrate 40.

The $n^+$-type channel stopper region 33 is exposed at the chip end. Between the $n^+$-type channel stopper region 33 and the voltage withstanding structure 30 (the outermost one of the $p^-$-type regions 32) is the $n^-$-type drift region 12. The $n^+$-type channel stopper region 33 has a floating potential. In the edge termination region 2, the front surface of the semiconductor substrate 40 is free of a field plate (FP) and a channel stopper electrode. Instead of the $n^+$-type channel stopper region 33, a $p^+$-type channel stopper region may be provided.

Operation of the silicon carbide semiconductor device 10 according to the first embodiment is described. When voltage that is at least equal to a gate threshold voltage is applied to the gate electrodes 18 while voltage (forward voltage) that is positive with respect to the source electrode 44 is applied to the drain electrode 45, a channel (n-type inversion layer) is formed in portions of the p-type base region 13, along the trenches 16. As a result, current flows from the $n^+$-type drain region 11, through the $n^-$-type drift region 12 and the channels to the $n^+$-type source regions 14, whereby the MOSFET (the silicon carbide semiconductor device 10) turns on.

On the other hand, when voltage lower than the gate threshold voltage is applied to the gate electrodes 18 while forward voltage is applied between a source and drain, pn junctions (main junctions of the active region 1) between the p-type base region 13, the $p^+$-type regions 21, 22 and the $p^+$-type extension portion 22a, and the n-type current spreading region 20 and the $n^-$-type drift region 12 are reverse biased, whereby the MOSFET maintains an off state. At this time, a depletion layer spreads in the $n^-$-type drift region 12, from the pn junctions, whereby electric field applied to the gate insulating films 17 at the bottoms of the trenches 16 is mitigated.

Further, a predetermined breakdown voltage based on dielectric field strength of silicon carbide and a width (width in the radial direction) of the depletion layer is ensured relative to an extent that the depletion layer spreads outward (direction to the chip end) in the $n^-$-type drift region 12 of the edge termination region 2, when the MOSFET is off. Further, when the MOSFET is off, electric field concentrates at the bottom of the $p^+$-type embedded region 26 and thus, local concentration of electric field at an outermost peripheral end (hereinafter, main junction end) of a main junction of the active region 1 may be suppressed. The main junction end of the active region 1 is the outer corner portion 25b of the bottom of the p-type outer peripheral region 25.

Next, a method of manufacturing the silicon carbide semiconductor device 10 according to the first embodiment is described. First, on the front surface of the $n^+$-type starting substrate ($n^+$-type starting wafer) 41, the $n^-$-type silicon carbide layer 42a, which constitutes the $n^-$-type drift region 12, is epitaxially grown. Next, the $p^+$-type regions 21, the lower portions 23 of the $p^+$-type regions 22, the lower portion 23a of the $p^+$-type extension portion 22a, and the $p^+$-type embedded region 26 are each selectively formed concurrently in the $n^-$-type silicon carbide layer 42a, at the surface thereof by photolithography and ion implantation of a p-type impurity.

Next, on the $n^-$-type silicon carbide layer 42a, the $n^-$-type silicon carbide layer 42b, which constitutes the $n^-$-type drift region 12, is epitaxially grown. Next, the upper portions 24 of the $p^+$-type regions 22 and the upper portion 24a of the $p^+$-type extension portion 22a are each selectively formed concurrently with one another in the $n^-$-type silicon carbide layer 42b by photolithography and ion implantation of a p-type impurity. At this time, the upper portions 24 and the lower portions 23 of the $p^+$-type regions 22 are connected in the depth direction. In the depth direction, the upper portion 24a and the lower portion 23a of the $p^+$-type extension portion 22a are connected.

Next, on the $n^-$-type silicon carbide layer 42b, the $n^-$-type silicon carbide layer 42c, which constitutes the $n^-$-type drift region 12 is epitaxially grown. By the processes up to here, the semiconductor substrate (semiconductor wafer) 40 of a predetermined thickness and in which the $n^-$-type silicon carbide layer 42 (42a to 42c) is stacked on the $n^+$-type starting substrate 41 is completed. In a case in which the n-type current spreading region 20 is formed, in the epitaxial growths of the $n^-$-type silicon carbide layers 42a, 42b, the lower portion and the upper portion of the n-type current spreading region 20 suffice to be formed respectively in the $n^-$-type silicon carbide layers 42a, 42b.

Next, the p-type base region 13 and the p-type base extension portion 13a are formed concurrently in the $n^-$-type silicon carbide layer 42c, by photolithography and ion implantation of a p-type impurity. In the $n^-$-type silicon carbide layer 42c, at the surface thereof, the $n^+$-type source regions 14 are selectively formed by photolithography and ion implantation of an n-type impurity. In the $n^-$-type silicon carbide layer 42c, at the surface thereof, the $p^{++}$-type contact regions 15d, 15c and the $p^{++}$-type contact extension portion 15a are each selectively formed concurrently with one another by photolithography and ion implantation of a p-type impurity.

In the $n^-$-type silicon carbide layer 42c, at the surface thereof, the p-type regions 31 and the $p^-$-type regions 32 are each selectively formed by photolithography and ion implantation of a p-type impurity. The p-type regions 31 and the $p^-$-type regions 32 are formed at different timings from each other. The depths d1 of the p-type regions 31 and the $p^-$-type regions 32 are shallower than the depth of the $p^{++}$-type contact extension portion 15a. In the $n^-$-type silicon carbide layer 42c, at the surface thereof, the $n^+$-type channel stopper region 33 is selectively formed by photolithography and ion implantation of an n-type impurity.

The $p^{++}$-type contact extension portion 15a, the p-type base extension portion 13a, and the $p^+$-type extension portion 22a are connected in the depth direction, whereby in the outer peripheral portion 1b of the active region 1, the p-type outer peripheral region 25 is formed. The p-type regions 31 and the $p^-$-type regions 32 form the voltage withstanding structure 30 in the edge termination region 2. A sequence in which diffused regions are formed in the n⁻-type silicon carbide layer 42c may be suitably changed. The n⁺-type channel stopper region 33 may be formed concurrently with the n⁺-type source regions 14.

A portion of the n⁻-type silicon carbide layer 42 (42a to 42c) remaining free of ion implantation and having the same impurity concentration as that at the time of epitaxial growth thereof constitutes the n⁻-type drift region 12. Next, a heat treatment for activating the impurities ion-implanted in the silicon carbide layer 42 is performed. The heat treatment for activating these impurities may be performed each time the impurities are ion-implanted in the silicon carbide layers 42a to 42c. Next, by a general method, the trenches 16, the gate insulating films 17, the gate electrodes 18, the field oxide film 51, and the gate polysilicon wiring layer 52 are formed.

Next, on an entire area of the front surface of the semiconductor substrate 40, the interlayer insulating film 19 is formed. Next, by a general method, the source electrode 44, the gate pad (not depicted), the gate metal wiring layer 53, a passivation film (surface protecting film, not depicted) and the drain electrode 45 are formed. A portion of the source electrode 44 exposed in an opening of the passivation film constitutes a source pad. Thereafter, the semiconductor wafer is diced (cut) into individual chips, whereby the silicon carbide semiconductor device 10 in FIGS. 1 to 3 is completed.

As described above, according to the first embodiment, at the outer end portion of the p-type outer peripheral region of the outer peripheral portion of the active region, steps are formed that are recessed stepwise toward the chip center and thereby, in the depth direction from the front surface of the semiconductor substrate, are arranged in ascending order of proximity thereof to the chip center. Thus, when the MOSFET is off, while the outer corner portion of the bottom of the p⁺⁺-type contact extension portion is a location where electric field concentrates, concentration of electric field at the outer corner portion of the bottom is mitigated by the voltage withstanding structure, which is adjacent to the p⁺⁺-type contact extension portion and closer to the chip end than is the p⁺⁺-type contact extension portion. Further, when the MOSFET is off, the electric field may be concentrated at the bottom of the p⁺-type embedded region of the edge termination region.

Therefore, local concentration of electric field at the main junction end (the outer corner portion of the bottom of the p-type outer peripheral region) of the active region may be suppressed and avalanche breakdown capability at the main junction end of the active region may be enhanced, whereby decreases in the breakdown voltage of the edge termination region may be suppressed. As a result, the breakdown voltage of the edge termination region may be sufficiently ensured and the breakdown voltage of the edge termination region may be suppressed from becoming lower than the breakdown voltage of the active region. Thus, the breakdown voltage of the silicon carbide semiconductor device overall may be determined by the breakdown voltage of the active region and reliability may be enhanced.

Further, according to the first embodiment, the device structure of the active region is formed by performing suitable ion implantation at each stage of epitaxial growth of the n⁻-type silicon carbide layer constituting the n⁻-type drift region. At this time, ion implantation mask patterns for forming p⁺⁺-type contact regions, the p-type base regions, and the p⁺-type regions of the active region are suitable changed, whereby steps of the outer end portion of the p-type outer peripheral region of the outer peripheral portion of the active region and the p⁺-type embedded region of the edge termination region may be easily formed without changing the method of forming the device structure of the active region.

Further, a spatial modulation JTE structure is formed as the voltage withstanding structure and the position in the radial direction and the width in the radial direction of the p-type regions configuring the voltage withstanding structure are adjusted, whereby a predetermined breakdown voltage of the edge termination region may be ensured. The position in the radial direction and the width in the radial direction of the p-type regions configuring the voltage withstanding structure may be easily adjusted by suitably setting the ion implantation mask pattern. Accordingly, a highly reliable silicon carbide semiconductor device that may be easily formed and that is capable of stably ensuring a predetermined breakdown voltage may be provided.

Figure 4:
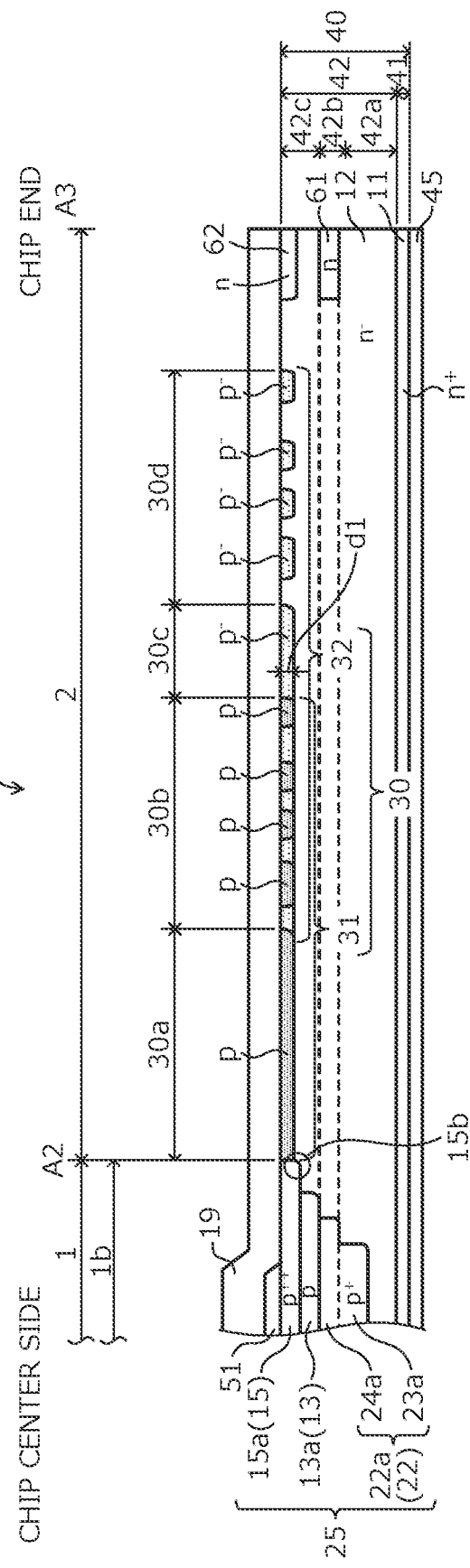
FIG. 4 is a cross-sectional view depicting the structure of a silicon carbide semiconductor device according to a second embodiment.

Next, a structure of a silicon carbide semiconductor device according to a second embodiment is described. FIG. 4 is a cross-sectional view depicting the structure of the silicon carbide semiconductor device according to the second embodiment. A layout of a silicon carbide semiconductor device 60 according to the second embodiment, when viewed from the front surface of the semiconductor substrate 40 thereof is similar to that of the first embodiment (refer to FIG. 1). The structure of the active region 1 of the silicon carbide semiconductor device 60 according to the second embodiment is similar to that of the first embodiment (refer to FIG. 2). FIG. 4 depicts a cross-sectional view of the structure along cutting line A2-A3 in FIG. 1.

The silicon carbide semiconductor device 60 according to the second embodiment differs from the silicon carbide semiconductor device 10 according to the first embodiment (refer to FIG. 3) in that instead of the p⁺-type embedded region 26, n-type channel stopper regions (first-conductivity-type channel stopper regions) are provided at multiple depths (in FIG. 4, two depths, n-type channel stopper regions 61, 62) so as to be apart from but facing each other in the depth direction. An impurity concentration the n-type channel stopper regions 61, 62 of the second embodiment may be lower than the impurity concentration of the n⁺-type channel stopper region 33 of the first embodiment.

The n-type channel stopper regions 61, 62 are provided closer to the chip end than is the voltage withstanding structure (the p-type regions 31 and the p⁻-type regions 32) 30 and are apart from the voltage withstanding structure 30 in the radial direction, the n-type channel stopper regions 61, 62 surround the periphery of the voltage withstanding structure 30. The n-type channel stopper regions 61, 62 have a conductivity type that is different from that of the voltage withstanding structure 30. Between the n-type channel stopper regions 61, 62 and the voltage withstanding structure 30 (the outermost one of the p⁻-type regions 32), the n⁻-type drift region 12 reaches the front surface of the semiconductor substrate 40. The n-type channel stopper regions 61, 62 are exposed at the chip end.

The n-type channel stopper regions 61, 62 have a floating potential. The n-type channel stopper regions 61, 62 are diffused regions formed by ion implantation in the n⁻-type silicon carbide layer 42 (for example, respectively, in the n⁻-type silicon carbide layers 42b, 42c) and have substantially the same width (width in the radial direction) and substantially the same thickness. The n-type channel stopper region 62 is in contact with the insulating film on the front surface of the semiconductor substrate 40. The n-type channel stopper region 61 is provided directly beneath the n-type channel stopper region 62 so as to be apart from the n-type channel stopper region 62.

Between the n-type channel stopper region 61 and the n-type channel stopper region 62 is the n⁻-type drift region 12. Between the n-type channel stopper region 61 and the n⁺-type drain region 11 is the n⁻-type drift region 12. In an instance in which the n-type channel stopper regions are provided apart from one another at three depths or more in the depth direction, the n-type channel stopper region of the first depth and in contact with the insulating film on the front surface of the semiconductor substrate 40 and the n-type channel stopper regions of the second and subsequent depths directly beneath and facing the n-type channel stopper region of the first level suffice to be provided at equal intervals in the depth direction.

A method of manufacturing the silicon carbide semiconductor device 60 according to the second embodiment suffices to be implemented by, for example, selectively forming the n-type channel stopper regions of each stage (in FIG. 4, the n-type channel stopper regions 61, 62) in epitaxially grown portions at each stage of epitaxial growth of the n⁻-type silicon carbide layer 42 (42a to 42c), in the method of manufacturing the silicon carbide semiconductor device 10 according to the first embodiment.

The first embodiment is applicable to the silicon carbide semiconductor device 60 according to the second embodiment and in the edge termination region 2, both the p⁺-type embedded region 26 (refer to FIG. 3) and n-type channel stopper regions (for example, the n-type channel stopper regions 61, 62) of multiple depths, facing but apart from one another in the depth direction may be provided.

As described above, according to the second embodiment, even in an instance in which instead of the p⁺-type embedded region, the n-type channel stopper regions are provided at multiple depths, facing but apart from one another in the depth direction, effects similar to those of the first embodiment may be obtained. Further, according to the second embodiment, the n-type channel stopper regions of each depth may be formed for each stage of epitaxial growth of the n⁻-type silicon carbide layer that constitutes the n⁻-type drift region and thus, n-type channel stopper regions of multiple depths may be easily formed without changing the method of manufacturing the device structure of the active region.

Further, while the deeper the n-type channel stopper regions are from the front surface of the semiconductor substrate, the greater is the effect of mitigating electric field, forming the n-type channel stopper regions deeply from the front surface of the semiconductor substrate by one stage is difficult. According to the second embodiment, n-type channel stopper regions are provided at multiple depths, facing but apart from one another in the depth direction, whereby even when the impurity concentration of the n-type channel stopper regions is set to be low, the effect of mitigating electric field may be obtained to a same extent as that in an instance in which the n-type channel stopper regions are formed deeply from the front surface of the semiconductor substrate by one stage.

Figure 5:
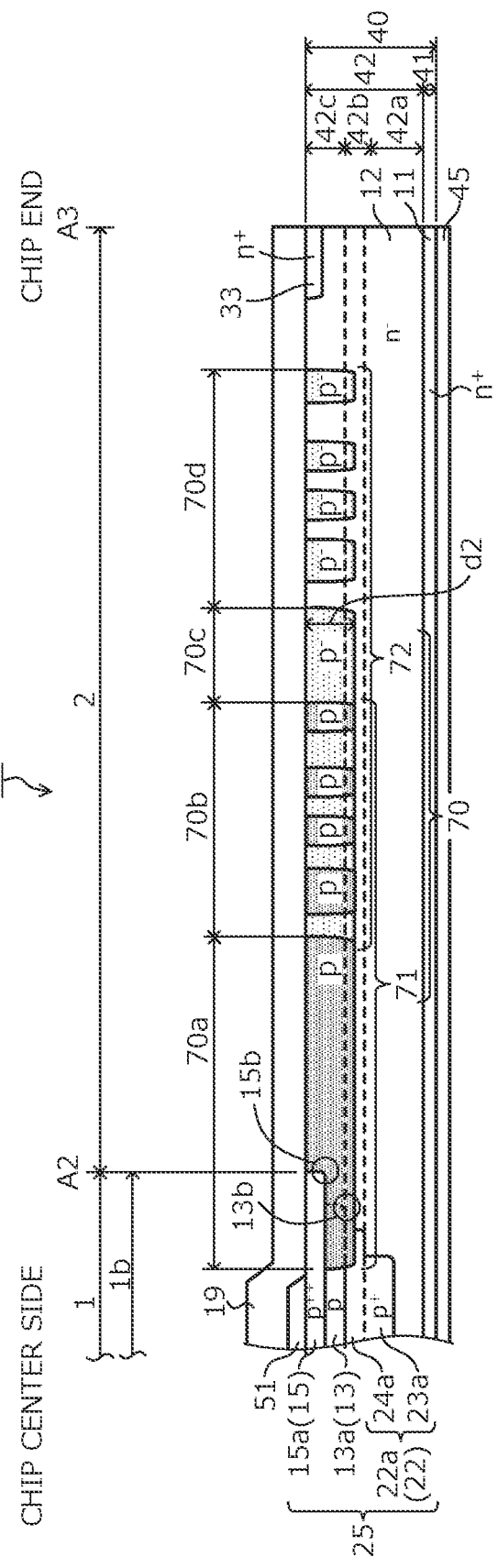
FIG. 5 is a cross-sectional view depicting the structure of a silicon carbide semiconductor device according to a third embodiment.

Next, a structure of a silicon carbide semiconductor device according to a third embodiment is described. FIG. 5 is a cross-sectional view depicting the structure of the silicon carbide semiconductor device according to the third embodiment. A layout of a silicon carbide semiconductor device 80 according to the third embodiment, when viewed from the front surface of the semiconductor substrate 40 thereof is similar to that of the first embodiment (refer to FIG. 1). The structure of the active region 1 of the silicon carbide semiconductor device 80 according to the third embodiment is similar to that of the first embodiment (refer to FIG. 2). FIG. 5 depicts a cross-sectional view of the structure along cutting line A2-A3 in FIG. 1.

The silicon carbide semiconductor device 80 according to the third embodiment differs from the silicon carbide semiconductor device 10 according to the first embodiment (refer to FIG. 3) in that instead of the p⁺-type embedded region 26, depths of bottoms of multiple p-type regions (second-conductivity-type voltage withstanding regions) 71 and multiple p⁻-type regions (second-conductivity-type voltage withstanding regions) 72 configuring a voltage withstanding structure 70 are deeper than the depth of the bottom of the p⁺⁺-type contact extension portion 15a and shallower than the depth of the bottom of the upper portion 24a of the p⁺-type extension portion 22a. Depths d2 of the p-type regions 71 and the p⁻-type regions 72 are all substantially the same and, for example, are about 1.0 μm from the front surface of the semiconductor substrate 40.

The p-type regions 71 and the p⁻-type regions 72 are diffused regions formed in the n⁻-type silicon carbide layer 42, at the surface thereof, by ion implantation. An innermost one (first second-conductivity-type voltage withstanding region) of the p-type regions 71 extends so that the bottom thereof is in contact with the p-type outer peripheral region 25. The innermost one of the p-type regions 71 surrounds the outer corner portion 15b of the bottom of the p⁺⁺-type contact extension portion 15a. In a direction from the innermost one of the p-type regions 71 adjacent to the p⁺⁺-type contact extension portion 15a and closer to the chip end than is the p⁺⁺-type contact extension portion 15a to the chip end, electric field applied to the outer corner portion 15b of the bottom of the p⁺⁺-type contact extension portion 15a is distributed by the voltage withstanding structure 70 overall.

The bottoms of the p-type regions 71 and the p⁻-type regions 72 may be deeper from the front surface of the semiconductor substrate 40 than is the bottom of the p-type base extension portion 13a. In this instance, the bottoms of the p-type regions 71 and the p⁻-type regions 72 are positioned in the n⁻-type silicon carbide layer 42b. The innermost one of the p-type regions 71 is disposed adjacent to the p⁺⁺-type contact extension portion 15a, the p-type base extension portion 13a, and the upper portion 24a of the p⁺-type extension portion 22a and is closer to the chip end than are these regions. Therefore, the innermost one of the p-type regions 71 further surrounds an outer corner portion 13b of the bottom of the p-type base extension portion 13a.

An inner end (end facing the chip center) of the innermost one of the p-type regions 71 may extend toward the chip center so as to overlap the p⁺⁺-type contact extension portion 15a and the p-type base extension portion 13a (or, additionally, the upper portion 24a of the p⁺-type extension portion 22a). Outer corner portions of the bottoms of the upper portion 24a and the lower portion 23a of the p⁺-type extension portion 22a are surrounded by the n⁻-type drift region 12. Other than the depth d2 of the p-type regions 71 and the p⁻-type regions 72 configuring the voltage withstanding structure 70, configuration thereof is similar to the configuration of the p-type regions 31 and the p⁻-type regions 32 configuring the voltage withstanding structure 30 of the first embodiment.

In other words, the voltage withstanding structure 70 is a spatial modulation JTE structure in which a JTE region 70a, a spatial modulation region 70b, a JTE region 70c, and a spatial modulation region 70d are sequentially disposed in the radial direction from the chip center to the chip end, and in which a p-type impurity concentration gradually decreases in a direction from the chip center to the chip end. Other than the depth d2 of the JTE regions 70a, 70c and the spatial modulation regions 70b, 70d of the voltage withstanding structure 70, configuration thereof is similar to that of the JTE regions 30a, 30c and the spatial modulation regions 30b, 30d of the voltage withstanding structure 30 of the first embodiment, respectively.

In the third embodiment, carrier concentration (concentration of the activated impurity) of the p-type regions 71 is suitably adjusted, whereby the breakdown voltage of the edge termination region 2 may be stably ensured to be sufficiently higher than the breakdown voltage of the active region 1. Even when the carrier concentration of the p-type regions 71 is set higher than the carrier concentration of the p-type base extension portion 13a (i.e., the p-type base region 13), as described above, the p-type regions 71 and the p$^-$-type regions 72 are provided at the depth d2, which is relatively deep from the front surface of the semiconductor substrate 40, whereby the breakdown voltage of the edge termination region 2 may be sufficiently ensured.

The breakdown voltage of the edge termination region 2 being stable means that even when the insulating film (the field oxide film 51 and the interlayer insulating film 19) on the front surface of the semiconductor substrate 40 in the edge termination region 2 is positively or negatively charged due to long operation of the silicon carbide semiconductor device 80, the breakdown voltage of the edge termination region 2 is maintained without fluctuation thereof to be at least equal to the breakdown voltage of the edge termination region 2 when the insulating film is in a normal state of being neither positively nor negatively charged (zero charge).

A method of manufacturing the silicon carbide semiconductor device 80 according to the third embodiment suffices to be implemented by forming, at the depth d2 of, for example, at least about 1.0 μm from the front surface of the semiconductor substrate 40, the p-type regions 71 and the p$^-$-type regions 72 that configure the voltage withstanding structure 70, so that the positions of the bottoms of the p-type regions 71 and the p$^-$-type regions 72 are deeper than the position of the bottom of the p$^{++}$-type contact extension portion 15a and shallower than the position of the bottom of the upper portion 24a of the p$^+$-type extension portion 22a, in the method of manufacturing the silicon carbide semiconductor device 10 according to the first embodiment.

For example, the p-type regions 71 and the p$^-$-type regions 72 configuring the voltage withstanding structure 70 suffice to be formed penetrating through the n$^-$-type silicon carbide layer 42c and terminating at the depth d2 in the n$^-$-type silicon carbide layer 42b, by ion implantation of a p-type impurity, after the n$^-$-type silicon carbide layer 42c, which is the uppermost, is epitaxially grown and the final thickness of the n$^-$-type silicon carbide layer 42 is achieved. Acceleration energy of the ion implantation of a p-type impurity for forming the p-type regions 71 and the p$^-$-type regions 72 is, for example, at least about 900 keV.

The first embodiment is applicable to the silicon carbide semiconductor device 80 according to the third embodiment and in the edge termination region 2, the p$^+$-type embedded region 26 (refer to FIG. 3) may be provided. The second embodiment may be applied to the silicon carbide semiconductor device 80 according to the third embodiment and in the edge termination region 2, multiple n-type channel stopper regions (for example, the n-type channel stopper regions 61, 62, refer to FIG. 4) that face but are apart from one another in the depth direction may be provided.

Further, in the edge termination region 2 of the silicon carbide semiconductor device 80 according to the third embodiment, both the p$^+$-type embedded region 26 of the first embodiment and the multiple n-type channel stopper regions of the second embodiment may be provided. The n-type channel stopper regions of the second embodiment are of a conductivity type that differs from that of the voltage withstanding structure 70 (the p-type regions 71 and the p$^-$-type regions 72) and thus, independent of the depth d2 of the voltage withstanding structure 70, the n-type channel stopper regions of the second embodiment may be disposed at deep positions from the front surface of the semiconductor substrate 40.

As described above, according to the third embodiment, the p-type regions and the p$^-$-type regions configuring the voltage withstanding structure are formed deeply from the front surface of the semiconductor substrate and the innermost one of p-type regions surrounds the outer corner portion of the bottom of the p$^{++}$-type contact extension portion (or, additionally, the outer corner portion of the bottom of the p-type base extension portion). As a result, concentration of electric field at the outer corner portion of the bottom of the p$^{++}$-type contact extension portion (additionally, the outer corner portion of the bottom of the p-type base extension portion) may be mitigated and effects similar to those of the first embodiment may be obtained.

Further, according to the third embodiment, the impurity concentration of the p-type regions configuring the voltage withstanding structure are suitably set, whereby even when charge accumulates in the insulating film on the front surface of the semiconductor substrate, in the edge termination region due to long operation of the silicon carbide semiconductor device, resistance to adverse effects of the charge may be enhanced. As a result, the breakdown voltage of the edge termination region 2 is maintained to be at least equal to the breakdown voltage of the edge termination region during a normal state (zero charge) when no charge is accumulated in the insulating film and the breakdown voltage of the edge termination region may be suppressed from becoming lower than the breakdown voltage of the active region.

Figure 6:
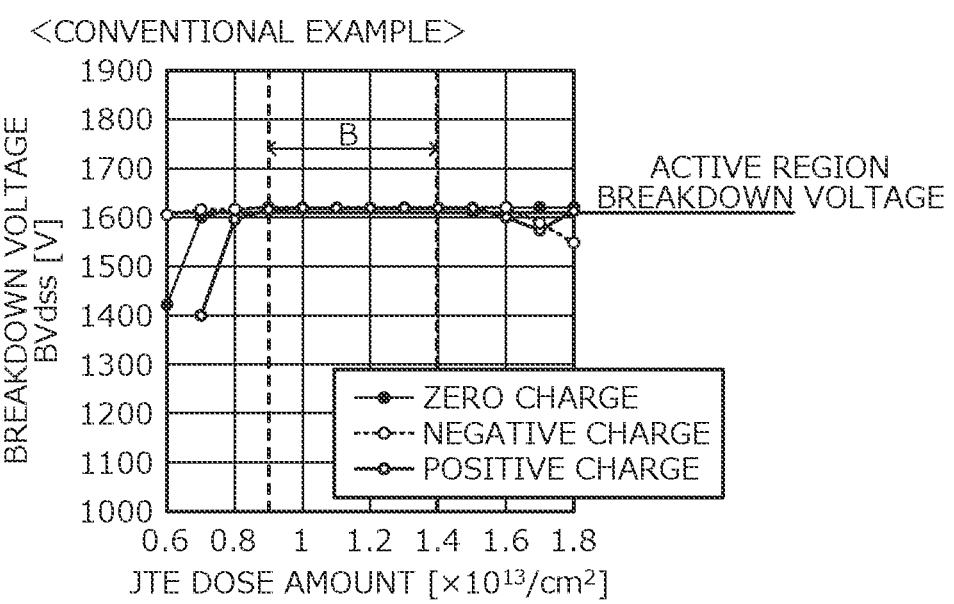
FIG. 6 is a characteristics diagram showing results of simulation of breakdown voltage characteristics of a conventional example.

Breakdown voltage characteristics of the described silicon carbide semiconductor device 80 according to the third embodiment (refer to FIG. 5) were verified. FIG. 6 is a characteristics diagram showing results of simulation of breakdown voltage characteristics of a conventional example. In FIG. 6, a horizontal axis indicates the dose amount of aluminum (Al) (hereinafter, JTE dose amount) activated of the aluminum ion-implanted to form the p-type regions 131 of the voltage withstanding structure 130 and a vertical axis indicates breakdown voltage of the edge termination region 102 of the conventional example.

Characteristics of the breakdown voltage of the edge termination region 2 during long operation of the described silicon carbide semiconductor device 80 according to the third embodiment (hereinafter, example) were simulated by variously changing the impurity concentration of the p-type regions 71 (not depicted). As described above, in the example, the p-type regions 71 and the p$^-$-type regions 72 configuring the voltage withstanding structure 70 are formed at the depth d2 of 1.0 μm from the front surface of the semiconductor substrate 40.

For comparison, results of simulation of breakdown voltage characteristics of the edge termination region 102 during long operation of the conventional silicon carbide semiconductor device 110 (hereinafter, conventional example, refer to FIG. 7) by variously changing the impurity concentration of the p-type regions 131 are shown in FIG. 6. The conventional example differs from the example in that the p-type regions 131 and the p⁻-type regions 132 configuring the voltage withstanding structure 130 are formed at the shallow depth d101 of 0.5 µm from the front surface of the semiconductor substrate 140.

FIG. 6 shows the results for three instances including an instance in which the insulating film 119 on the front surface of the semiconductor substrate 140 in the edge termination region 102 is positively charged (positive charge is accumulated) due to long operation of the conventional example, an instance in which the insulating film 119 is negatively charged (negative charge is accumulated) due to long operation of the MOSFET, and an instance of a normal state (zero charge) in which the insulating film 119 is not charged. Simulations for the example and the conventional example were performed under the same conditions.

From the results shown in FIG. 6, it was confirmed that in the conventional example, at the outer end portion of the p-type outer peripheral region 125 of the outer peripheral portion 101b of the active region 101, steps are formed that are recessed stepwise toward the chip center and thereby, in the depth direction from the front surface of the semiconductor substrate 140, are arranged in ascending order of proximity thereof to the chip center, whereby decreases in the breakdown voltage of the edge termination region 102 are suppressed. As a result, the breakdown voltage of the edge termination region 102 although slightly higher than the breakdown voltage of the active region 101 was about the same as the breakdown voltage of the active region 101.

In particular, in the conventional example, it was confirmed that when the JTE dose amount of the p-type regions 131 of the voltage withstanding structure 130 is in a range B of about $9 \times 10^{12}/cm^2$ to $1.4 \times 10^{13}/cm^2$, independent of whether the insulating film 119 on the front surface of the semiconductor substrate 140, in the edge termination region 102, is charged, the breakdown voltage of the edge termination region 102 is stabilized at the same breakdown voltage as that of the active region 101. The breakdown of the active region 101 is set to 1600V.

In this manner, in the conventional example, a difference of the breakdown voltage of the edge termination region 102 and the breakdown voltage of the active region 101 is small and thus, due to decreases in avalanche breakdown capability in the edge termination region 102 and operation exceeding the reverse bias safe operating area (RBSOA), etc., the breakdown voltage of the edge termination region 102 becomes lower than the breakdown voltage of the active region 101 and destruction in the edge termination region 102 may occur.

On the other hand, in the example, the p-type regions 71 and the p⁻-type regions 72 configuring the voltage withstanding structure 70 are formed at the depth d2 of 1.0 µm from the front surface of the semiconductor substrate 40 and surround the outer corner portion 15b of the bottom of the p⁺⁺-type contact extension portion 15a. As a result, as compared to the conventional example, it was confirmed that while variation of the breakdown voltage of the edge termination region 2 is large with respect to the JTE dose amount of the p-type regions 71 of the voltage withstanding structure 70, the breakdown voltage of the edge termination region 2 may be set sufficiently higher than the breakdown voltage of the active region 1 (not depicted).

In particular, it was confirmed that when the JTE dose amount of the p-type regions 71 of the voltage withstanding structure 70 is in a range of about $8.5 \times 10^{12}/cm^2$ to $1.4 \times 10^{13}/cm^2$, independent of whether the insulating film (the interlayer insulating film 19 and the field oxide film 51) on the front surface of the semiconductor substrate 40, in the edge termination region 2, is charged, the breakdown voltage of the edge termination region 2 is stabilized at a breakdown voltage that is in an upper range of 1600V to about 1800V and sufficiently higher than the breakdown voltage (=1600V) of the active region 1.

Thus, as a range of allowable variation of the JTE dose amount of the p-type regions 71 of the voltage withstanding structure 70, a range of the JTE dose amount of the p-type regions 71 enabling the breakdown voltage of the edge termination region 2 to be stably ensured to be sufficiently higher than the breakdown voltage of the active region 1 is obtained in advance by simulation. Further, it was confirmed that by forming the p-type regions 71 within the range of allowable variation of the JTE dose amount of the p-type regions 71, sufficient reliability may be expected.

In the foregoing, the present invention is not limited to the described embodiments and various modifications within a range not departing from the spirit of the invention are possible. For example, the structure of the active region depicted in FIG. 2 is one example and instead of the trench gate structure, for example, the structure may be a planar gate structure. In other words, in the outer peripheral portion of the active region, the device structure of the active region may be suitably changed provided that the p-type outer peripheral region that surrounds the periphery of the center portion of the active region is formed so that at the outer end portion of the p-type outer peripheral region, steps are formed that are recessed stepwise toward the chip center and thereby, in the depth direction from the front surface of the semiconductor substrate, are arranged in ascending order of proximity thereof to the chip center.

Further, instead of the spatial modulation JTE structure, a general JTE structure may be provided in contact with the p-type outer peripheral region of the outer peripheral portion of the active region and the insulating film on the front surface of the semiconductor substrate. A general JTE structure is a structure in which multiple p-type regions (JTE regions) are disposed in descending order of impurity concentration in a direction from the chip center to the chip end, in adjacent concentric shapes surrounding the periphery of the active region. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, in the outer end portion of the second-conductivity-type outer peripheral region of the outer peripheral portion of the active region, steps are formed that are recessed stepwise toward the chip center and in direction away from the front surface of the semiconductor substrate, are arranged in ascending order of proximity thereof to the chip center, whereby the outer corner portion of the bottom of the first extension portion is a location where electric field concentrates when the silicon carbide semiconductor device is off, nonetheless, the concentration of electric field at the outer corner portion of the bottom of the first extension portion is mitigated by the voltage withstanding structure, which is adjacent to the first extension portion and closer to the chip end than is the first extension portion. Further, when the silicon carbide semiconductor device is off, electric field may be caused to concentrate at the bottom of the second-conductivity-type embedded region of the termination region.

Thus, local concentration of electric field at the main junction end (outer corner portion of the bottom of the second-conductivity-type outer peripheral region) of the active region may be suppressed and avalanche breakdown capability at the main junction end of the active region may be enhanced, whereby decreases in the breakdown voltage of the termination region may be suppressed. As a result, the breakdown voltage of the termination region may be sufficiently ensured and the breakdown voltage of the termination region is suppressed from becoming lower than the breakdown voltage of the active region. Therefore, the breakdown voltage of the silicon carbide semiconductor device overall may be determined by the breakdown voltage of the active region.

Further, according to the present invention, the second-conductivity-type outer peripheral region of the outer peripheral portion of the active region and the second-conductivity-type embedded region of the termination region may be formed by ion implantation in the semiconductor substrate concurrently with regions (of the device structure of the active region) having the same impurity concentration and the same depth. Therefore, the pattern of the ion implantation masks for forming the regions of the device structure of the active region are suitably changed, whereby the second-conductivity-type outer peripheral region and the second-conductivity-type embedded region may be easily formed without changing the method of forming the device structure of the active region.

The silicon carbide semiconductor device according to the invention achieves an effect in that a highly reliable silicon carbide semiconductor device that is easily formed and that is capable of stabilizing and ensuring a predetermined breakdown voltage may be provided.

As described, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide and having a first main surface and a second main surface that are opposite to each other, an entire area of the first main surface being flat, the semiconductor substrate having an active region in a center of the semiconductor substrate and a termination region that surrounds a periphery of the active region;
a first semiconductor region of a first conductivity type, provided in the semiconductor substrate, spanning the active region and the termination region;
a second semiconductor region of a second conductivity type, provided between the first main surface and the first semiconductor region, in the active region;
a device structure having a pn junction between the first semiconductor region and the second semiconductor region, a current that passes through the pn junction flowing through the device structure;
a second-conductivity-type outer peripheral region surrounding the periphery of the active region, the second-conductivity-type outer peripheral region being provided between the first main surface and the first semiconductor region, between the device structure and the termination region;
a voltage withstanding structure configured by a plurality of second-conductivity-type voltage withstanding regions, provided between the first main surface and the first semiconductor region, in the termination region, the plurality of second-conductivity-type voltage withstanding regions being provided apart from one another in a direction parallel to the first main surface in concentric shapes surrounding the periphery of the active region;
a first electrode electrically connected to the second semiconductor region and the second-conductivity-type outer peripheral region, the first electrode being provided at the first main surface; and
a second electrode electrically connected to the first semiconductor region, the second electrode being provided on the second main surface of the semiconductor substrate, wherein
the second-conductivity-type outer peripheral region has, at an outer end portion thereof, a plurality of extension portions each extending outward in a radial direction toward an end of the semiconductor substrate and terminating so that in the depth direction from the first main surface, the plurality of extension portions are arranged in descending order of proximity thereof to the end of the semiconductor substrate, thereby forming a plurality of steps that are recessed stepwise from an outer end of the outer end portion toward the center of the semiconductor substrate and in a depth direction from the first main surface, are arranged in ascending order of proximity thereof to the center,
the voltage withstanding structure is in contact with an outer end of a first extension portion that is an uppermost one among the plurality of extension portions, the uppermost one being closest to the first main surface among the plurality of extension portions, and
the silicon carbide semiconductor device further comprises in the termination region, a second-conductivity-type embedded region surrounding the periphery of the active region, the second-conductivity-type embedded region being provided apart from the voltage withstanding structure and the second-conductivity-type outer peripheral region, at a same depth as a depth of a second extension portion that is a lowermost one among the plurality of extension portions, the lowermost one being closest to the second main surface among the plurality of extension portions.

2. The silicon carbide semiconductor device according to claim 1, wherein
the plurality of second-conductivity-type voltage withstanding regions includes a first second-conductivity-type voltage withstanding region, and
the second-conductivity-type embedded region faces, in the depth direction, the first second-conductivity-type voltage withstanding region.

3. The silicon carbide semiconductor device according to claim 2, wherein
the second-conductivity-type embedded region is positioned closer to the center of the semiconductor substrate than is an outer end portion of the first second-conductivity-type voltage withstanding region.

4. The silicon carbide semiconductor device according to claim 1, wherein an impurity concentration of the second-conductivity-type embedded region is equal to an impurity concentration of the second extension portion.

5. The silicon carbide semiconductor device according to claim 1, wherein
an impurity concentration of the second-conductivity-type embedded region is higher than an impurity concentration of the plurality of second-conductivity-type voltage withstanding regions.

6. The silicon carbide semiconductor device according to claim 1, wherein
the device structure has:
a plurality of third semiconductor regions of the first conductivity type, electrically connected to the first electrodes, the plurality of third semiconductor regions being selectively formed between the first main surface and the second semiconductor region,
a plurality of trenches penetrating through the plurality of third semiconductor regions and the second semiconductor region and reaching the first semiconductor region,
a plurality of gate electrodes provided in the plurality of trenches, via a plurality of gate insulating films, respectively, and
a plurality of second-conductivity-type high-concentration regions selectively provided between the first semiconductor region and the second semiconductor region so as to be closer to the second main surface than are bottoms of the plurality of trenches, an impurity concentration of the plurality of second-conductivity-type high-concentration regions being higher than an impurity concentration of the second semiconductor region, and
the plurality of extension portions of the second-conductivity-type outer peripheral region further includes third and fourth extension portions, wherein
the third extension portion is a portion of the second semiconductor region, that is disposed closer to the end of the semiconductor substrate than is the device structure, the third extension portion having a first surface and a second surface that are opposite to each other, the second surface of the third extension portion facing the second main surface,
the first extension portion is provided in contact with the third extension portion between the first main surface and the third extension portion, an impurity concentration of the first extension portion being higher than an impurity concentration of the third extension portion,
the fourth extension portion is a first part of the plurality of second-conductivity-type high-concentration regions, that is disposed closer to the end of the semiconductor substrate than is the device structure and faces the first main surface, the fourth extension portion being adjacent to the second surface of the third extension portion, and the second extension portion is a second part of the plurality of second-conductivity-type high-concentration regions, that is disposed closer to the end of the semiconductor substrate than is the device structure, and is different from the first part, the second extension portion being provided between and in contact with the fourth extension portion and the first semiconductor region.

7. The silicon carbide semiconductor device according to claim 6, wherein
bottoms of the plurality of second-conductivity-type voltage withstanding regions are positioned closer to the first main surface than is a bottom of the first extension portion.

8. The silicon carbide semiconductor device according to claim 6, wherein
bottoms of the plurality of second-conductivity-type voltage withstanding regions are positioned closer to the second main surface than is a bottom of the first extension portion and closer to the first main surface than is a bottom of the fourth extension portion.

9. The silicon carbide semiconductor device according to claim 8, wherein
a depth of the plurality of second-conductivity-type voltage withstanding regions from the first main surface is at least 1.0 µm.

10. The silicon carbide semiconductor device according to claim 8, wherein
the voltage withstanding structure surrounds an outer corner portion of the bottom of the first extension portion.

11. The silicon carbide semiconductor device according to claim 10, wherein
the voltage withstanding structure surrounds an outer corner portion of a bottom of the third extension portion.

12. The silicon carbide semiconductor device according to claim 1, further comprising
a plurality of first-conductivity-type channel stopper regions of multiple depths, facing but apart from one another in the depth direction, the plurality of first-conductivity-type channel stopper regions being provided in the first semiconductor region so as to be apart from the voltage withstanding structure and closer to the end of the semiconductor substrate than is the voltage withstanding structure.

13. The silicon carbide semiconductor device according to claim 1, wherein
the voltage withstanding structure has a spatial modulation structure in which an impurity concentration of the second conductivity type gradually decreases in an entire area of the spatial modulation structure, in a direction from the center to the end of the semiconductor substrate.

* * * * *